United States Patent [19]

Harada et al.

[11] Patent Number: 5,733,434
[45] Date of Patent: Mar. 31, 1998

[54] APPARATUS AND METHOD FOR CLEANING SEMICONDUCTOR WAFERS

[75] Inventors: Yasuyuki Harada, Tokyo, Japan; Shigeyoshi Netsu, Kuala Lumpur, Malaysia; Shouichi Miura, Tokyo, Japan

[73] Assignees: Pre-Tech Co., Ltd.; Shin-Etsu Handotai Co., Ltd., both of Tokyo, Japan

[21] Appl. No.: 648,696

[22] Filed: May 16, 1996

[30] Foreign Application Priority Data

May 31, 1995 [JP] Japan ................... 7-133570
Nov. 14, 1995 [JP] Japan ................... 7-295256

[51] Int. Cl.[6] ................................ C02F 1/461
[52] U.S. Cl. ............ 205/746; 205/748; 205/749; 205/766; 204/252; 204/253; 204/255; 134/1.3
[58] Field of Search ................... 205/687, 746, 205/748, 749, 766; 204/255, 253, 252; 134/1.3

[56] References Cited

U.S. PATENT DOCUMENTS 5,543,030  8/1996  Shiramizu et al. ............... 205/742
5,578,193  11/1996  Aoki et al. .......................... 205/746

Primary Examiner—Arun S. Phasge
Attorney, Agent, or Firm—Wenderoth, Lind & Ponack

[57] ABSTRACT

An improvement is proposed in the cleaning treatment of semiconductor silicon wafers in which the conventional step of cleaning with an aqueous solution of an acid is replaced with a cleaning treatment with a temporarily acidic pure water which is produced electrolytically by the application of a DC voltage between an anode and a cathode bonded to the surfaces of a hydrogen-ion exchange membrane so that the acidic cleaning treatment can be performed under mild conditions so as to eliminate the troubles unavoidable in the conventional process. The apparatus used therefor comprises a rectangular vessel partitioned into a central anode compartment, in which the wafers are held in a vertical disposition within an upflow of pure water, and a pair of cathode compartments on both sides of the anode compartment by partitioning with a pair of hydrogen-ion exchange membranes, on both sides of which an anode plate and a cathode plate are bonded.

14 Claims, 10 Drawing Sheets

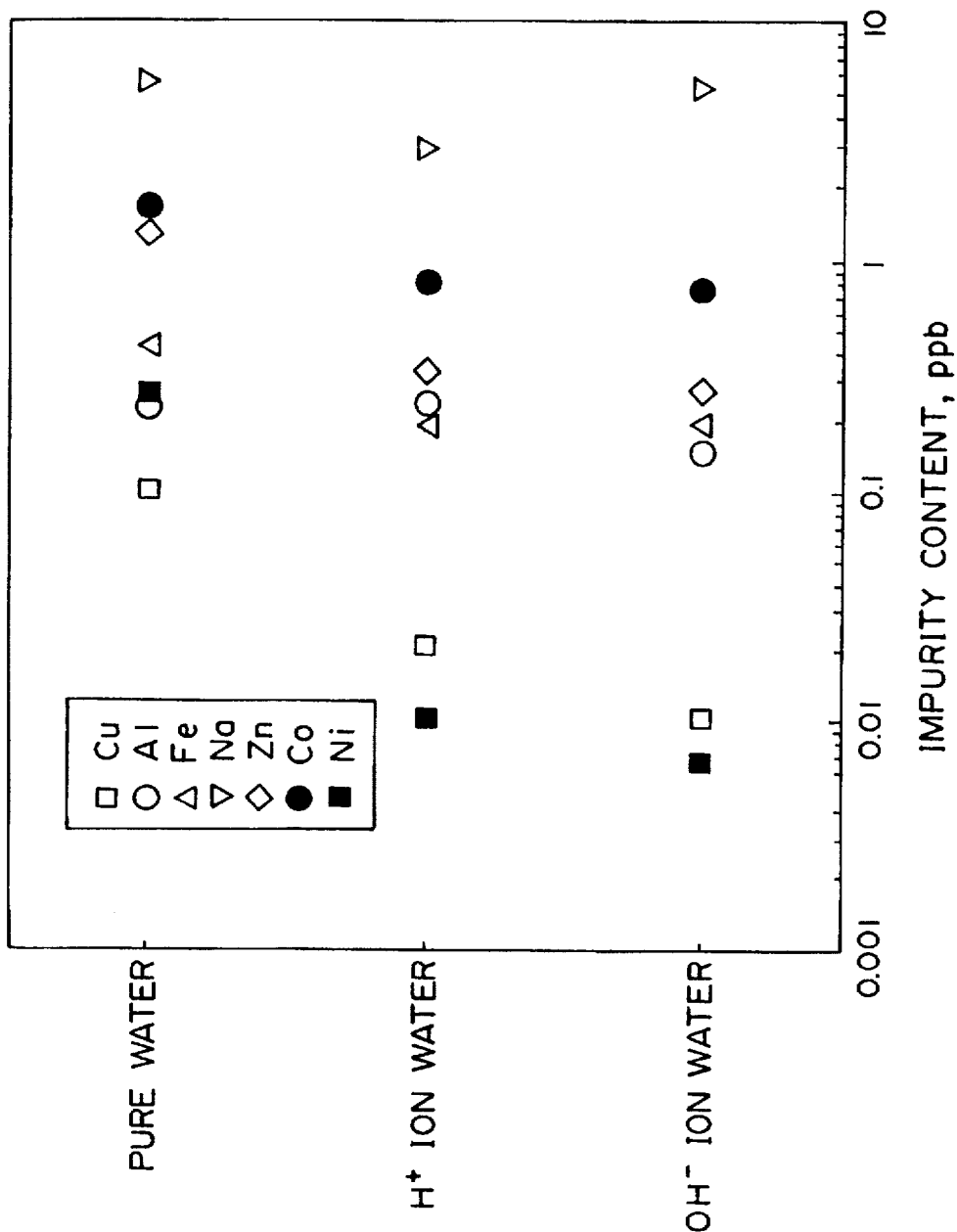

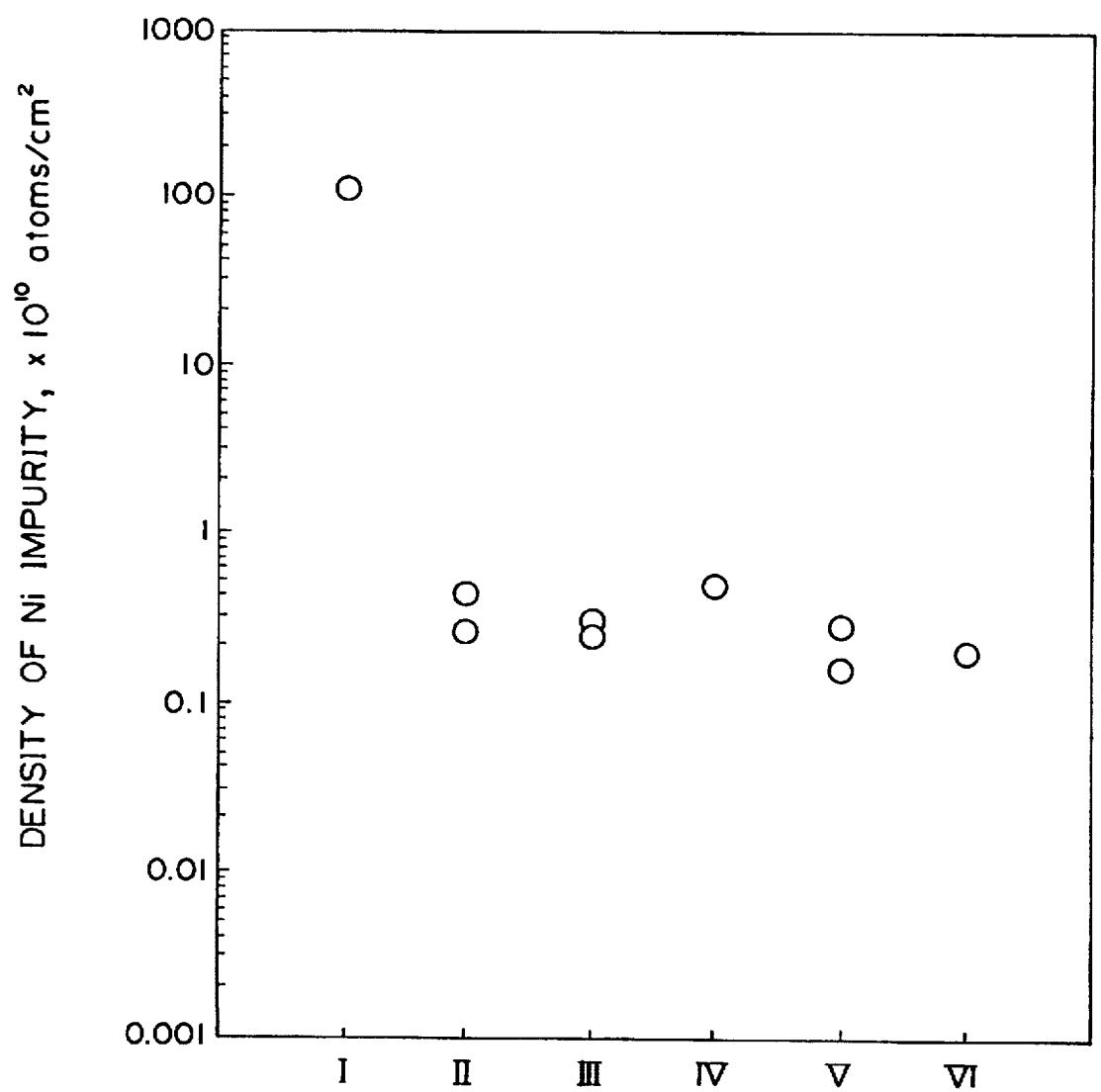

APPARATUS AND METHOD FOR CLEANING SEMICONDUCTOR WAFERS

BACKGROUND OF THE INVENTION

The present invention relates to an apparatus for cleaning semiconductor wafers and a method for cleaning semiconductor wafers by using the apparatus. More particularly, the invention relates to an apparatus for wet-process cleaning of semiconductor wafers, such as single crystal silicon wafers, capable of efficiently giving a very reliable cleaning effect in the manufacturing process thereof or in the manufacturing process of semiconductor devices using the wafers as a substrate as well as a method for cleaning semiconductor wafers by using the apparatus.

As is known, the degree of integration in various semiconductor devices is increasing year by year toward an extremely high density. Along with this trend, it is increasingly very important to keep a highly clean condition of the working environment for the manufacture of semiconductor devices and also to ensure high cleanness of the semiconductor wafers as the base material of semiconductor devices.

In this regard, it is an indispensable procedure that all of semiconductor wafers be subjected to a cleaning treatment with an object to remove any foreign materials including tiny particulate bodies called particles and contaminants such as metallic impurities, organic matters, surface films formed by spontaneous or natural oxidation and adsorption along with an additional effect of improving the planarity of the surface so as to eliminate troubles thereby and to increase the yield of acceptable products in the manufacturing process of semiconductor devices and to improve the reliability in the performance of the devices.

While various proposals and attempts have been made heretofore for the cleaning treatment of semiconductor wafers, the method most widely under practical applications is the so-called RCA cleaning method developed by W. Kern et al. of RCA Corporation, U.S.A., during 1960s. A typical sequence of this RCA method consists of two or three steps including the first step using an SC-1 (RCA Standard Clean-1) cleaning solution which is an aqueous solution of ammonia and hydrogen peroxide ($NH_4OH/H_2O_2/H_2O$) to remove particles and organic matters and the second step using an SC-2 cleaning solution which is an aqueous solution of hydrogen chloride and hydrogen peroxide ($HCl/H_2O_2/H_2O$) to remove metallic contaminants with optional intervention of an additional step between the SC-1 and SC-2 cleaning treatments using a DHF (diluted hydrogen fluoride) cleaning solution which is an aqueous solution of hydrogen fluoride ($HF/H_2O$) to remove the surface films formed by the SC-1 cleaning treatment. It is understood that the effectiveness of the above mentioned SC-1 cleaning solution in the RCA method for the removal of particles and organic matters is obtained by the etching activity of ammonia as an ingredient therein.

It is also known, on the other hand, that a single crystal rod of semiconductor silicon obtained by the Czochralski method inherently contains crystal defects called as-grown defects introduced in the course of the crystal growing process. When a silicon wafer containing such as-grown defects appearing on the surface is subjected to an etching treatment, the rate of etching is greater at or in the vicinity of the crystal defects than on the surface areas free from such crystal defects so that proceeding of etching is not uniform over the whole surface but selective on the areas including the crystal defects unavoidably resulting in the formation of tiny cavities called "pits".

Occurrence of pits mentioned above on the surface of a silicon wafer causes a serious problem in the control of particles on the wafer surface in the cleaning treatment thereof. Since it is usual that the number of particles deposited on the wafer surface is counted with a particle counter which is an instrument to count the number of the bright spots due to scattering light when the wafer surface is scanned with a laser beam, namely, the pits also act as the scattering sites for the laser beam and the particle counter detects the bright spots due to the pits as a positive bias over the number of true particles. The pit to cause an erroneous increment in the number of particles counted by a particle counter is called a COP (crystal-originated particle).

A problem accompanying the existence of COPs on the wafer surface is that the electric breakdown characteristic of the gate oxidized film on a semiconductor device may be subject to degradation thereby so that a countermeasure against generation of COPs on the wafer surface, which was considered as a rather insignificant problem in the prior art, must be taken into consideration as a very important problem to comply with the recent trend in the semiconductor technology toward a higher and higher density of integration of semiconductor devices.

The cleaning solutions used in the RCA cleaning method are also not free from several problems. For example, the SC-1 cleaning solution is generally ineffective for the removal of metallic impurities as compared with acidic cleaning solutions excepting for the metallic elements capable of forming a complex compound with ammonia such as copper. The SC-2 cleaning solution, on the other hand, has an excellent cleaning effect on metallic impurities though less effective on particles and organic matters. A problem in the use of the SC-2 cleaning solution is that the hydrogen peroxide contained therein has an oxidizing activity so that an oxidized surface film of silicon is formed thereby on the wafer surface and the effectiveness thereof is considered to be decreased when the concentration of metallic impurities is high.

It is of course that the cleaning method for semiconductor wafers by using the cleaning solutions as described above has a limitation in the applicability thereof because, in the cleaning work undertaken in the manufacturing process of semiconductor devices, for example, the cleaning solution may attack the parts such as circuit wirings made from metals such as aluminum exposed bare and dissolve away the metallic parts or the cleaning solution may infiltrate through interstices or pinholes to attack metallic parts embedded in interlayer films resulting in a serious problem of corrosion.

To summarize, each of the conventional cleaning methods of semiconductor wafers including the RCA method as a typical one has problems that the procedure of the cleaning method using several different cleaning solutions in sequence is necessarily lengthy and troublesome necessitating use of a multistage cleaning apparatus for the respective cleaning solutions in addition to the problems inherent in the respective cleaning solutions due to the chemicals contained therein. Needless to say, the cleaning treatment of silicon wafers conducted in several sequential steps is disadvantageous not only in respect of the expensiveness due to the large investment for facilities and high running costs for labors and materials including chemicals and pure water or deionized water but also in respect of the environmental pollution in connection with the waste water and depleted cleaning solutions discharged in large volumes out of the cleaning process. It is therefore a desirable approach to develop a cleaning method of silicon wafers in which the volume of cleaning solutions to be used can be minimized as far as possible or, if possible, to develop a method in which no cleaning solutions are used. Many proposals and attempts have been made heretofore in this direction.

For example, Japanese Patent Kokai 6-260480 discloses an apparatus and method for cleaning of semiconductor wafers, according to which an electrolytic vessel having two compartments as partitioned with a porous membrane is provided with a cathode rod and an anode rod in the respective compartments to produce hydroxyl ion ($OH^-$)-containing water and hydrogen ion ($H^+$)containing water in the cathode and anode compartments, respectively, under continuous introduction of water containing an electrolyte to enhance the electrolytic efficiency into each of the cathode and anode compartments and the ion-containing effluents from the respective compartments are led to two treatment vessels installed separately, in which semiconductor wafers are subjected to the cleaning treatment.

While the cleaning treatment with the hydroxyl ion-containing water can be construed to be equivalent to the cleaning treatment with the SC-1 cleaning solution in the RCA method, the above mentioned Japanese patent document takes a position that the role played by the hydroxyl ions consists in the stabilization of the aluminum surface activated by the hydrogen ion treatment and removal of colloidal silica particles remaining on the surface after the process of polishing or planarization but is silent on the removal of particles in general for which the SC-1 cleaning solution is effective and on the positive merit thereby as a countermeasure against COPs of which the RCA method cannot provide any significant improvements.

According to the same Japanese patent document as above, however, the method involves several serious problems to be solved including the great danger due to the use of a very high direct-current voltage to be applied between the cathode and anode which is as high as $10^3$ to $10^4$ volts/cm and the difficulties encountered in preventing a decrease or in controlling the effective concentrations of the hydroxyl and hydrogen ions in the respective effluents coming out of the electrolytic vessel since the hydroxyl ions and hydrogen ions produced in the respective compartments are unstable ions so that the ion-containing water returns to neutral water in a while sometimes before the effluents reach the respective treatment vessels installed separately.

SUMMARY OF THE INVENTION

The present invention accordingly has an object to provide a novel and improved apparatus and an improved method for the cleaning treatment of semiconductor wafers using the apparatus by which the above described problems in the conventional apparatuses and methods can be solved to be freed from the disadvantages.

Thus, the apparatus of the present invention for the cleaning treatment of semiconductor wafers according to a first aspect of the invention comprises:

(a) a rectangular vessel to contain an aqueous medium for cleaning of a semiconductor wafer by holding the semiconductor wafer as a workpiece in a substantially vertical disposition in the center part thereof, said rectangular vessel being partitioned in the lengthwise direction into an anode compartment at the center and a pair of cathode compartments on both sides of the anode compartment;

(b) a pair of partitions each partitioning the anode compartment and one of the cathode compartments, each partition being formed of a pair of hydrogen-ion exchange membranes, one, facing the anode compartment and, the other, facing the cathode compartment to form a flow passage therebetween;

(c) a pair of anode plates each bonded to one of the ion exchange membranes on the surface facing the anode compartment; and (d) a pair of cathode plates each bonded to one of the ion exchange membranes on the surface facing the cathode compartment at such a position approximately to oppose to the anode plate.

The apparatus of the present invention for the cleaning treatment of semiconductor wafers according to a second aspect of the invention comprises:

(a) a rectangular vessel to contain an aqueous medium for cleaning of a semiconductor wafer by holding the semiconductor wafer as a workpiece in a substantially vertical disposition in the center part thereof, said rectangular vessel being partitioned in the lengthwise direction into an anode compartment at the center and a pair of cathode compartments on both sides of the anode compartment;

(b) a pair of hydrogen-ion exchange membranes each partitioning the anode compartment and one of the cathode compartments;

(c) a pair of anode plates each bonded to one of the ion exchange membranes on the surface facing the anode compartment; and (d) a pair of cathode plates each bonded to one of the ion exchange membranes on the surface facing the cathode compartment at such a position approximately to oppose to the anode plate.

It is preferable that, in each of the apparatuses defined above according to the first and second aspects of the invention, an ultrasonic transducer is provided on the bottom of the anode compartment so that the efficiency of the cleaning treatment can be greatly improved by applying ultrasonic waves to the cleaning medium in the anode compartment.

The method of the present invention for the cleaning treatment of a semiconductor wafer by using the above defined apparatus of the invention comprises the steps of:

(a) holding a semiconductor wafer in the anode compartment in a substantially vertical disposition;

(b) introducing pure water continuously into each of the anode compartment, the cathode compartments and, in the apparatus of the first aspect, the flow passages formed between a pair of ion exchange membranes at the bottom thereof;

(c) discharging the pure water continuously from the top of each of the anode compartment, the cathode compartments and, in the apparatus of the first aspect, the flow passages formed between a pair of ion exchange membranes;

(d) applying a direct-current voltage between the anode plate and the cathode plate; and, optionally, (e) applying ultrasonic waves to the pure water in the anode compartment.

BRIEF DESCRIPTION OF THE DRAWINGS

FIG. 5 is a diagram showing the concentrations of various kinds of metallic impurities in the starting pure water, in hydrogen ion-containing water and in hydroxyl ion-containing water taken from the inventive apparatus.

FIGS. 6A, 6B, 6C, 6D and 6E are each a diagram showing the densities of copper, iron, nickel, zinc and aluminum, respectively, as impurities on the surface of silicon wafers after various treatments.

DETAILED DESCRIPTION OF THE PREFERRED EMBODIMENTS

Figure 1A:
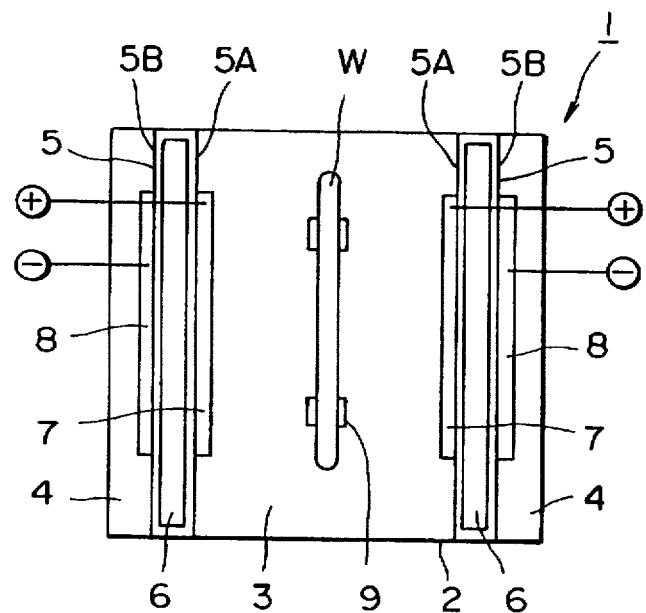
FIGS. 1A and 1B schematically illustrate a plan view and a side view, respectively, of the inventive apparatus according to the first aspect.

As is described above, the apparatus of the invention for the cleaning treatment of semiconductor wafers in a variety of embodiments can be classified into those according to the first aspect of the invention and those according to the second aspect of the invention.

The inventive apparatus according to the first aspect of the invention comprises:

(a) a rectangular vessel to contain an aqueous medium for cleaning of a semiconductor wafer by holding the semiconductor wafer as a workpiece in a substantially vertical disposition in the center part thereof, said rectangular vessel being partitioned in the lengthwise direction into an anode compartment at the center and a pair of cathode compartments on both sides of the anode compartment;

(b) a pair of partitions each partitioning the anode compartment and one of the cathode compartments, each partition being formed of a pair of hydrogen-ion exchange membranes, one, facing the anode compartment and, the other, facing the cathode compartment, to form a flow passage therebetween;

(c) a pair of anode plates each bonded to the ion exchange membrane on the surface facing the anode compartment; and (d) a pair of cathode plates each bonded to the ion exchange membrane on the surface facing the cathode compartment at such a position approximately to oppose to the anode plate, each of the anode and cathode plates having substantially identical area.

It is preferable that an ultrasonic transducer is provided on the bottom of the anode compartment so that the efficiency of the cleaning treatment can be greatly improved by the application of ultrasonic waves to the cleaning medium in the anode compartment.

The inventive apparatus according to the second aspect of the invention comprises:

(a) a rectangular vessel to contain an aqueous medium for cleaning of a semiconductor wafer by holding the semiconductor wafer as a workpiece in a substantially vertical disposition in the center part thereof, said rectangular vessel being partitioned in the lengthwise direction into an anode compartment at the center and a pair of cathode compartments on both sides of the anode compartment;

(b) a pair of hydrogen-ion exchange membranes each partitioning the anode compartment and one of the cathode compartments;

(c) a pair of anode plates each bonded to the ion exchange membrane on the surface facing the anode compartment; and (d) a pair of cathode plates each bonded to the ion exchange membrane on the surface facing the cathode compartment at such a position approximately to oppose to the anode plate.

The apparatus according to the second aspect of the invention can also be equipped with an ultrasonic transducer on the bottom of the anode compartment so that the efficiency of the cleaning treatment can be greatly improved by the application of ultrasonic waves to the cleaning medium in the anode compartment.

It is advantageous that each of the anode plates and cathode plates in the above described embodiments of the inventive apparatus is a plate provided with a large number of perforations.

The method of the present invention for the cleaning treatment of a semiconductor wafer using the apparatus according to the first aspect of the invention described above comprises the steps of:

(a) holding a semiconductor wafer in the anode compartment in a substantially vertical disposition;

(b) introducing pure water continuously into each of the anode compartment, the cathode compartments and the flow passages formed between a pair of ion exchange membranes at the bottom thereof;

(c) discharging the pure water continuously from the top of each of the anode compartment, the cathode compartments and the flow passages formed between a pair of ion exchange membranes; and (d) applying a direct-current voltage between the anode plate and the cathode plate.

The method of the present invention for the cleaning treatment of a semiconductor wafer using the apparatus according to the second aspect of the invention described above comprises the steps of:

(a) holding a semiconductor wafer in the anode compartment in a substantially vertical disposition;

(b) introducing pure water continuously into each of the anode compartment and cathode compartments at the bottom thereof;

(c) discharging the pure water continuously from the top of each of the anode compartment and cathode compartments; and (d) applying a direct-current voltage between the anode plate the cathode plate.

In the following, the apparatus and method of the invention for the cleaning treatment of a semiconductor wafer are described in more detail by making reference to the accompanying drawing.

Figure 1B:
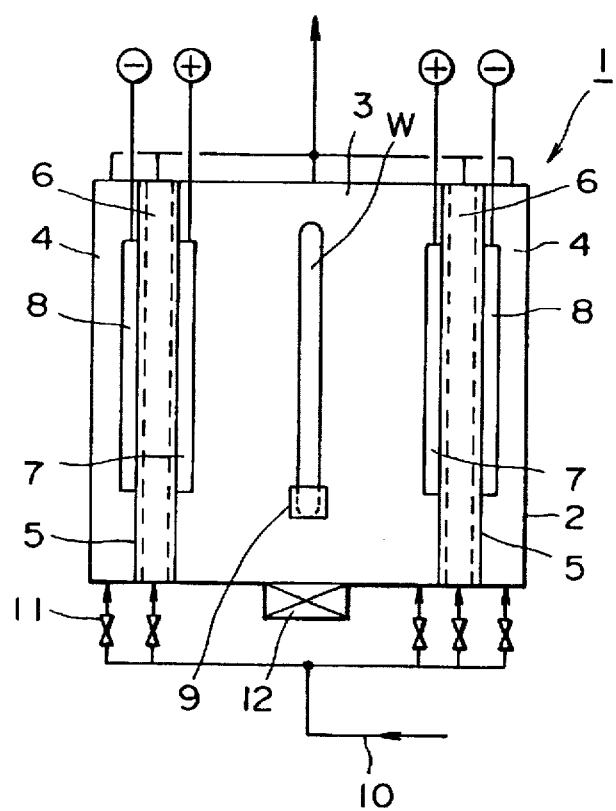

FIGS. 1A and 1B of the accompanying drawing schematically illustrate a plan view and a side view, respectively, of the inventive apparatus 1 according to the first aspect. The body 2 of the apparatus is an upwardly opening box-like vessel having the form of a rectangular parallelepiped on of which at least the inner surface layer is made from a material such as fused silica glass which is absolutely free from leaching of any impurities into pure water in an ionized state. It is of course optional that the body 2 is made from a corrosion-resistant material such as stainless steel and the inner surface thereof is lined with a material free from leaching of impurities.

The rectangular box-like vessel 2 of the apparatus 1 is partitioned into an anode compartment 3 and a pair of cathode compartments 4,4 on both sides of the anode compartment 3 by means of a pair of partitions 5,5 each made of a pair of hydrogen-ion exchange membranes 5A,5B in an opposite and parallel disposition forming a flow passage 6 therebetween. In the embodiment illustrated in these figures, the ion exchange membranes 5A and 5B are integrated into the form of something like a card case with a thin space 6 inside. A pair of anode plates 7,7 are bonded each to one of the hydrogen-ion exchange membranes 5A,5A on the surface facing the anode compartment 3 in such a position of an approximately middle height of the vessel 2 to face a workpiece W held in the anode compartment 3 with a holder 9. A pair of cathode plates 8,8 are bonded each to one of the hydrogen-ion exchange membranes 5B,5B on the surface facing the respective cathode compartments 4,4 at such an approximate position as to oppositely face the anode plates 7,7.

The electrode plates, i.e. anode plates 7,7 and cathode plates 8,8, are made each from platinum or from a less expensive metal such as tantalum, titanium and the like with a plating layer of platinum and have a configuration close to the shape and dimensions of the workpiece W to be treated in the apparatus, though not particularly limitative.

A semiconductor wafer W as the workpiece to be subjected to a cleaning treatment in the inventive apparatus is held in a substantially vertical disposition in the center part of the cleaning vessel 2 or anode compartment 3 by means of a cassette-less type holder or a clamping device 9 capable of holding the wafer W in point contact at the periphery of the wafer W. Although FIGS. 1A and 1B illustrate only a single wafer W held by the holder 9, it is of course that a plurality of wafers are held jointly by means of a holder so that the cleaning treatment of a number of wafers can be performed at one time. When a single wafer W is held in the anode compartment 3 by a holder 9, it is not always necessary that the wafer W is in such a disposition that the flat surfaces thereof are in parallel to the anode plates 7,7 but can be in a perpendicular or biased disposition relative to the anode plates 7,7. When a plurality of wafers are subjected to the cleaning treatment at one time, on the other hand, it is preferable that the wafers are held in parallel each to the others keeping a space between adjacent wafers by means of a suitable holder capable of holding the wafers in point contact at the peripheries thereof and the holder is fixed in the anode compartment 3 in such a direction that the flat surfaces of the wafers are perpendicular to the anode plates 7,7.

As is illustrated in FIG. 1B, each of the anode compartment 3, cathode compartments 4,4 and flow passages 6,6 is connected at the bottom thereof to a branch of the pipeline 10 through a valve 11 for controlling the flow rate, through which pure water is introduced into the respective compartments and flow passages at a controlled rate. The anode compartment 3, in which the wafers W are held for the cleaning treatment, is open at the top and the pure water continuously introduced thereinto at the bottom and rising therein is discharged at the top thereof as an effluent over an overflow weir (not shown in the figure). The pure water rising in the cathode compartments 4,4 and flow passages 6,6 is collected in a pure-water tank (not shown in the figure) through a pipeline or as an effluent over the overflow weir for the anode compartment 3 and re-used after purification in a pure-water regenerator (not shown in the figure). Though optional, an ultrasonic transducer 12 is installed at the bottom of the anode compartment 3.

In conducting the cleaning treatment of semiconductor wafers by using the above described apparatus, the wafer W is held by the holder 9 and placed at an appropriate position in the anode compartment 3. Pure water or deionized water is then introduced into each of the anode compartment 3, cathode compartments and flow passages 6,6 from the pipeline 10 through the respective branches and respective control valves 11 at a controlled flow rate. The pure water rising therein and reaching the top is discharged continuously through the pipelines for discharge installed at the top to be discarded or at least partly re-purified and collected in a pure water tank (not shown in the figure). While keeping the upward flow of pure water in the compartments and flow passages, the anode plates 7,7 and the cathode plates 8,8 are connected to a direct-current power source (not shown in the figure) so that an electrode reaction expressed by the equation:

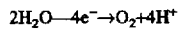

takes place to form hydrogen ions $H^+$ in the pure water contained in the anode compartment 3. The pure water thus containing the hydrogen ions is temporarily acidic and acts on the semiconductor wafer in a way similar to the effect in the acidic cleaning treatment by the use of the so-called SC-2 cleaning solution.

Though optional as is mentioned before, an ultrasonic transducer 12 is provided on the bottom of the anode compartment 3 so that ultrasonic waves can be applied to the pure water in the anode compartment 3. Although installation of an ultrasonic transducer in a vessel for cleaning of semiconductor wafers is known as a means to effect mechanical action for the removal of particles from the surface of wafers under cleaning, the significance of ultrasonic waves in the inventive apparatus and method is very unique and the ultrasonic waves exhibit a synergistic effect with the hydrogen ions electrolytically formed in the pure water.

Figure 2:
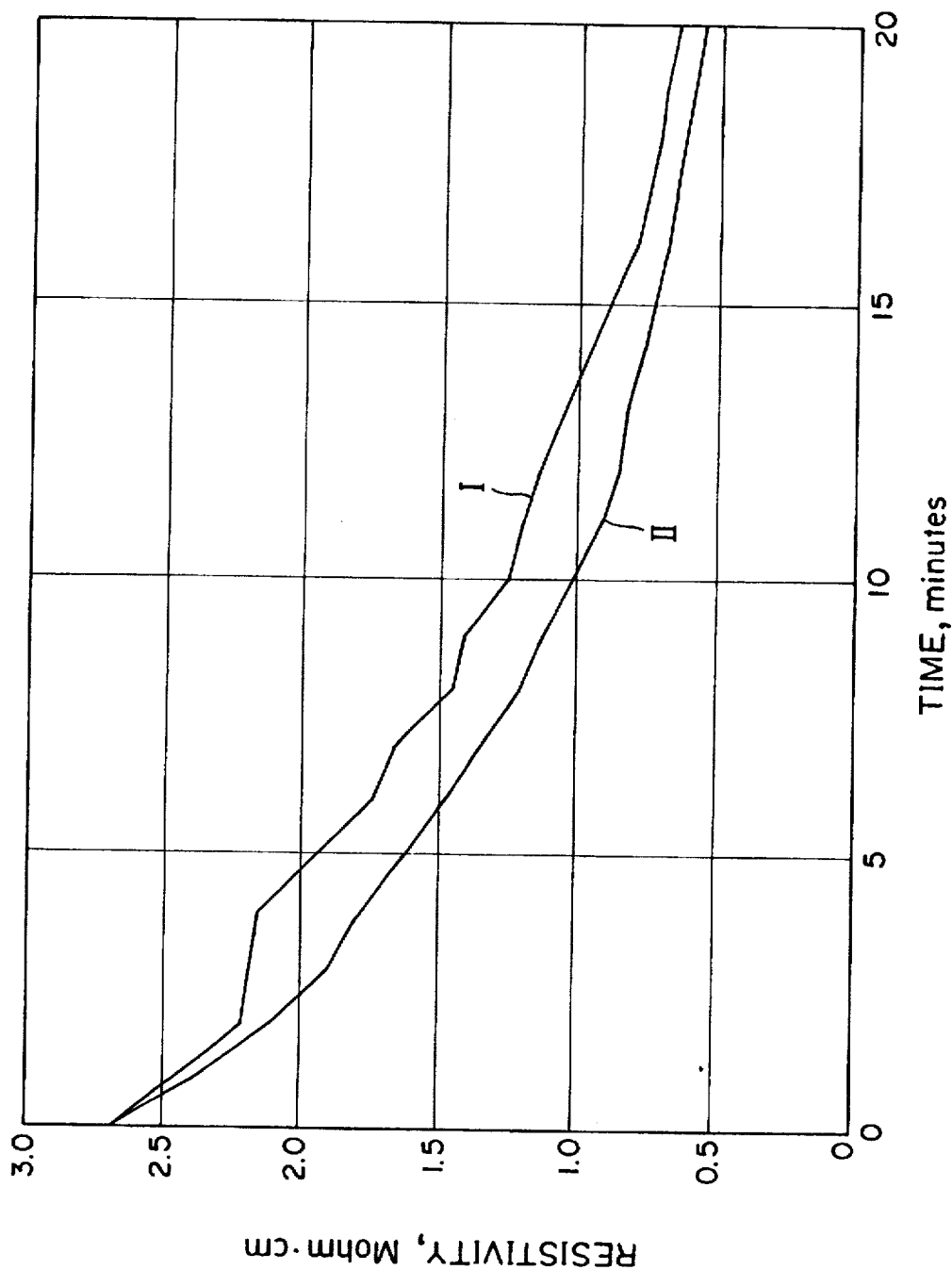
FIG. 2 is a graph showing resistivity of pure water in a field of ultrasonic waves of different frequencies as a function of duration for the application of ultrasonic waves.

Namely, FIG. 2 of the accompanying drawing is a graph showing the electric resistivity of pure water contained in the anode compartment 3 under application of ultrasonic waves of different frequencies as a function of the length of time for the application of the ultrasonic waves, of which the curves I and II were obtained with application of ultrasonic waves at frequencies of 800 kHz and 3.0 MHz, respectively. As is clear from this graph, the resistivity of pure water is markedly decreased by the application of ultrasonic waves as the time for the ultrasonic application is extended and this effect is particularly remarkable when the ultrasonic frequency is 800 kHz or higher while the resistivity of pure water is decreased only slightly, presumably, due to absorption of carbon dioxide from the atmosphere in the absence of ultrasonic waves.

Though not well understood, the above mentioned phenomenon could be qualitatively interpreted in terms of the mechano-chemical activity of ultrasonic waves on the water molecules to promote the free radical activity thereof and formation of certain ions. This means that a desired electrolytic current can be obtained at a relatively low electrolytic voltage, which otherwise is accompanied by a decrease in the hydrogen ion concentration in the anode compartment 3, as compared with that in the absence of ultrasonic waves. As a consequence, a synergistically enhanced cleaning effect can be obtained by the combination of the removing effect of particles with the ultrasonic waves and the effect of the acidic cleaning treatment.

Each of the partitions 5,5 formed of a pair of hydrogen-ion exchange membranes 5A,5B with a flow passage 6 formed therebetween partitions the anode compartment 3 and one of the cathode compartments 4,4 and the hydrogen ions released from the membrane 5A into the pure water in the flow passage 6 are carried away by the upflow of the pure water flowing through the flow passage 6 to be removed from the system so that the efficiency of the cleaning treatment can be increased so much even at a relatively low direct-current voltage applied to the electrode plates.

In place of the partitions 5,5 illustrated in FIGS. 1A and 1B each consisting of a pair of ion exchange membranes 5A,5B, it is optional to use a pair of partitions each formed from a meshed bag made from plastic filaments which is filled with beads of a cation exchange resin having a conventional particle size distribution and sandwiched between an anode plate 7 and a cathode plate 8 to be flattened in the form of a partition wall. In this case, the partitions are not provided with the flow passages and the resistance as an electrolytic vessel can be further decreased.

Figure 3A:
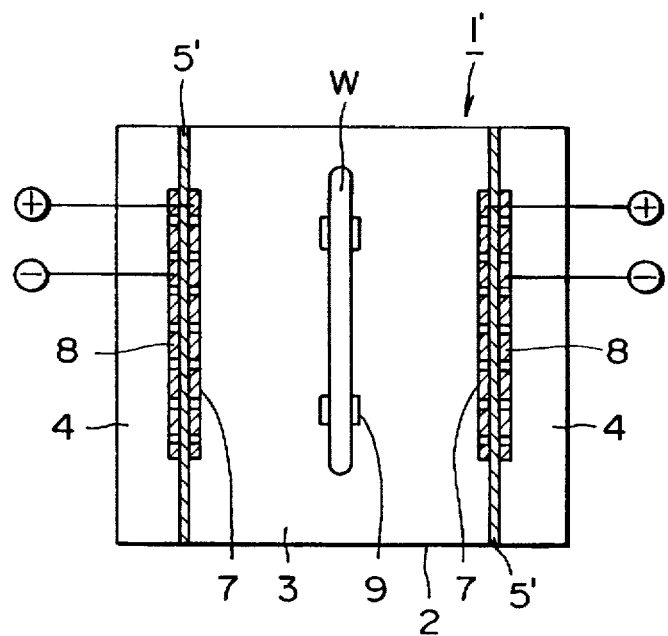
FIGS. 3A and 3B schematically illustrate a plan view and a side view, respectively, of the inventive apparatus according to the second aspect. The partitions are shown by the cross section.
Figure 3B:
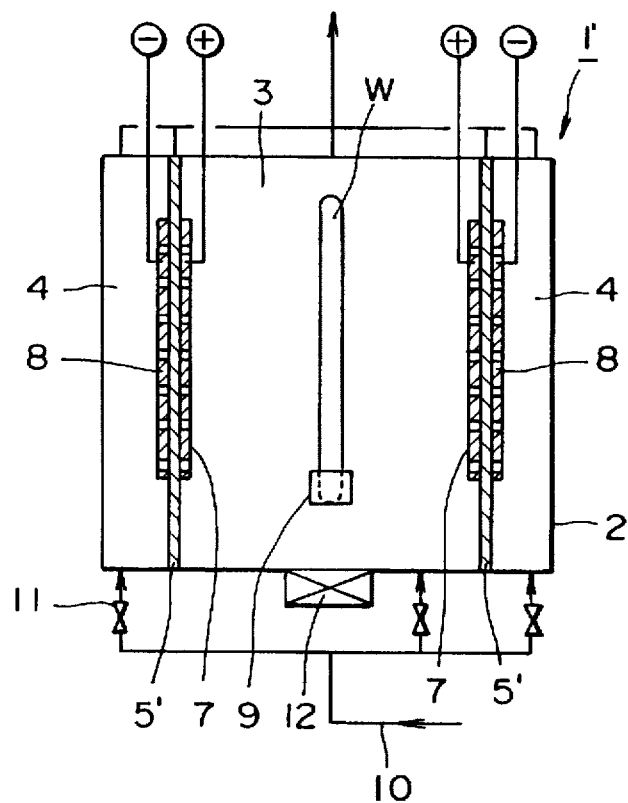

FIGS. 3A and 3B illustrate the inventive apparatus 1' according to the second aspect by a plan view and a side view, respectively, to give substantially the same cleaning effect as in the apparatus illustrated in FIGS. 1A and 1B, in which the rectangular vessel 2 is partitioned into an anode compartment 3 and a pair of cathode compartments 4,4 by a pair of partitions 5',5', each of which is made of a hydrogen-ion exchange membrane in the form of a single sheet in place of the partitions 5,5 in FIGS. 1A and 1B each of which is formed of a pair of ion exchange membranes 5A, 5B forming a flow passage 6 therebetween. A pair of anode plates 7,7 are bonded each to one of the partitions 5',5' on the surface facing the anode compartment 3 while a pair of cathode plates 8,8 are bonded each to one of the partitions 5',5' on the surface facing the cathode compartment 4. In these figures, the assembly of the ion exchange membrane 5' and the electrode plates 7,8 is illustrated by a cross sectional view showing that each of the electrode plates 7,8 is provided with perforations as is mentioned below.

Thus, an additional advantage can be obtained in improving the efficiency of electrolysis of the pure water by the application of a direct-current voltage between the anode plate 7 and cathode plate 8 provided on the surfaces of the partition 5' thereby to increase the cleaning effect on the semiconductor wafers W when a large number of perforations are formed in these electrode plates. Though not particularly limitative, the perforations each have a diameter of 2 to 3 mm and are arranged to keep a distance of 2 to 3 mm from adjacent ones.

In conducting the cleaning treatment by applying a direct-current voltage between the electrode plates 7,8, the voltage should be adequately selected to give an appropriate electrolytic current with consideration of various factors such as the dimensions of the cleaning vessel, distance between the electrode plates depending on the size of the vessel, surface area of the electrode plates, characteristics of the ion exchange membranes, concentration of ions in water, safety in running and so on. When the problem of safety in running is taken as the first requisite, accordingly, it is possible to design the apparatus to work under application of a direct-current voltage in the range from 10 volts to several tens of volts with a current density of around 0.05 to 0.5 A/cm² to be free from serious safety problems.

The efficiency of electrolysis in the apparatus illustrated in FIGS. 1A,1B or FIGS. 3A,3B can be greatly improved by providing a pair of hydrogen ion-permeable membranes each forming a sub-compartment between the anode compartment and one of the anode plates and an aqueous containing an acid or a neutral salt free from halogen is passed through the respective sub-compartments.

As is described above, the present invention provides a novel method of acidic cleaning treatment equivalent to the so-called SC-2 cleaning treatment by the use of an inventive apparatus illustrated in FIGS. 1A and 1B or in FIGS. 3A and 3B in which the pure water in the anode compartment can be rendered acidic by the electrolytic means, optionally, with concurrent application of ultrasonic waves. It is an additional advantage that the same apparatus can be used to serve for the alkaline cleaning treatment equivalent to the so-called SC-1 cleaning treatment by reversing the polarity of the direct-current voltage applied to the electrode plates thus to convert the anode plates to cathode plates and the cathode plates to anode plates. The above described versatility of the inventive cleaning apparatus provides a further advantage of the invention that the acidic and alkaline cleaning treatments of a semiconductor wafer can be performed successively or alternately in a single cleaning apparatus by passing pure water through each of the compartments and applying a direct-current voltage under reversal of the polarity between the anodes and cathodes.

Figure 4A:
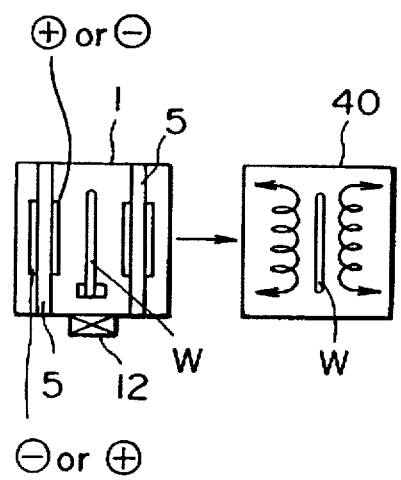
FIG. 4A is a schematic flow diagram showing the cleaning process using a single apparatus of the invention and a drying process and FIG. 4B is a schematic flow diagram of the whole cleaning process using the inventive apparatus followed by subsequent treatments in rinse apparatuses.
Figure 4B:
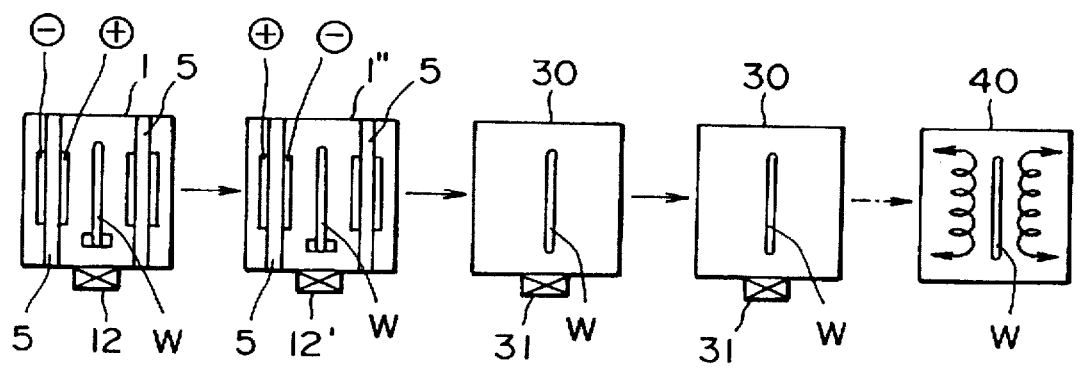
Figure 6A:
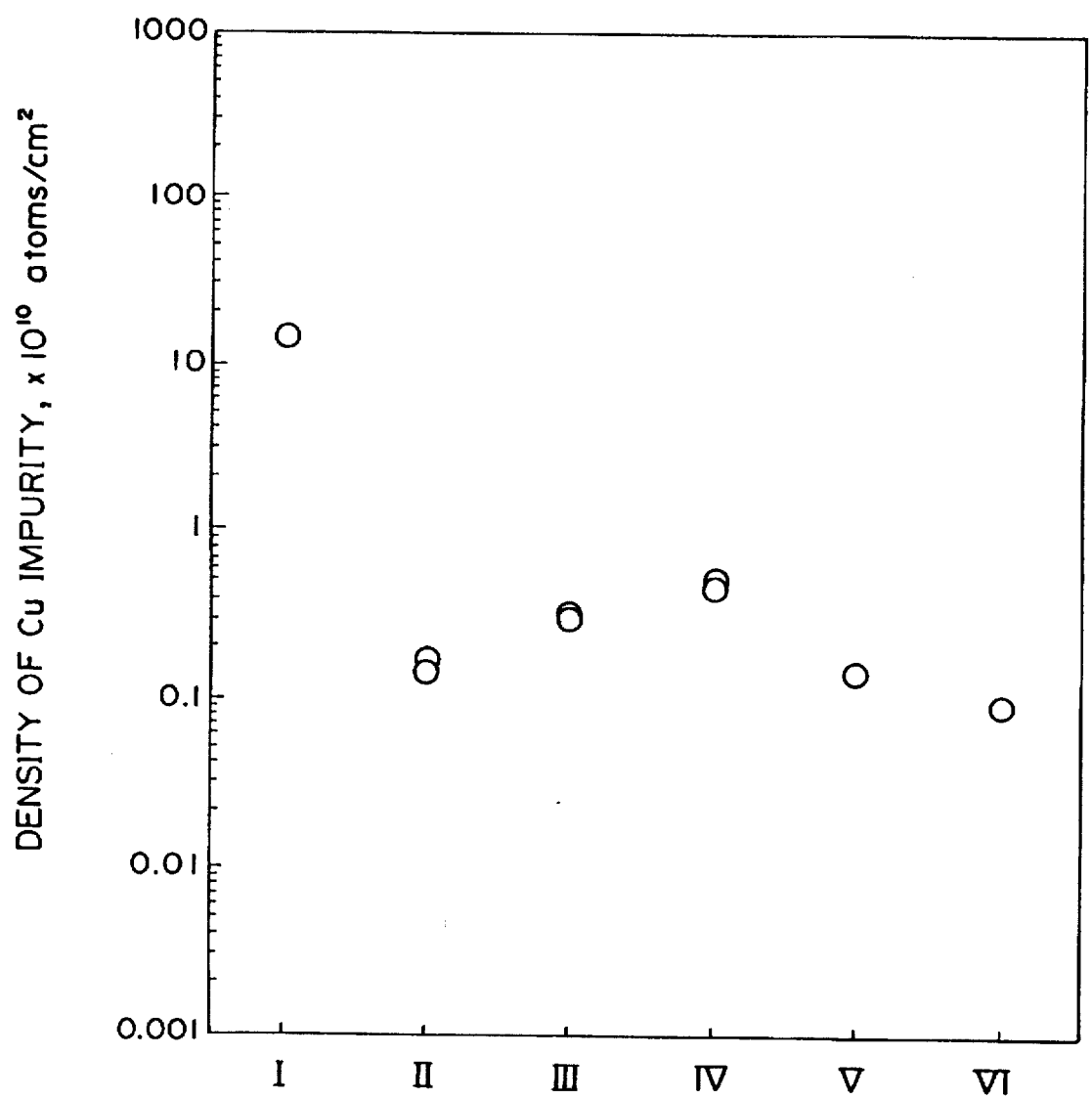
Figure 6B:
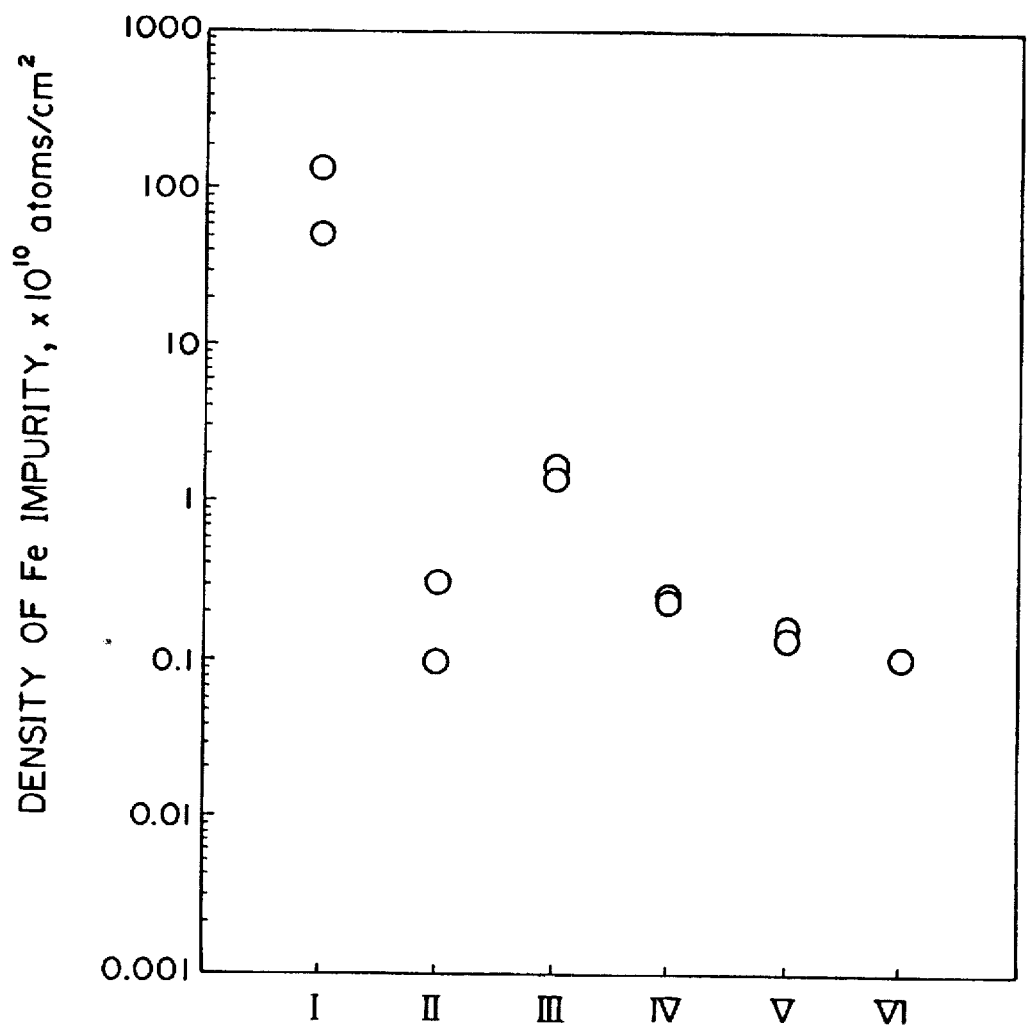
Figure 6D:
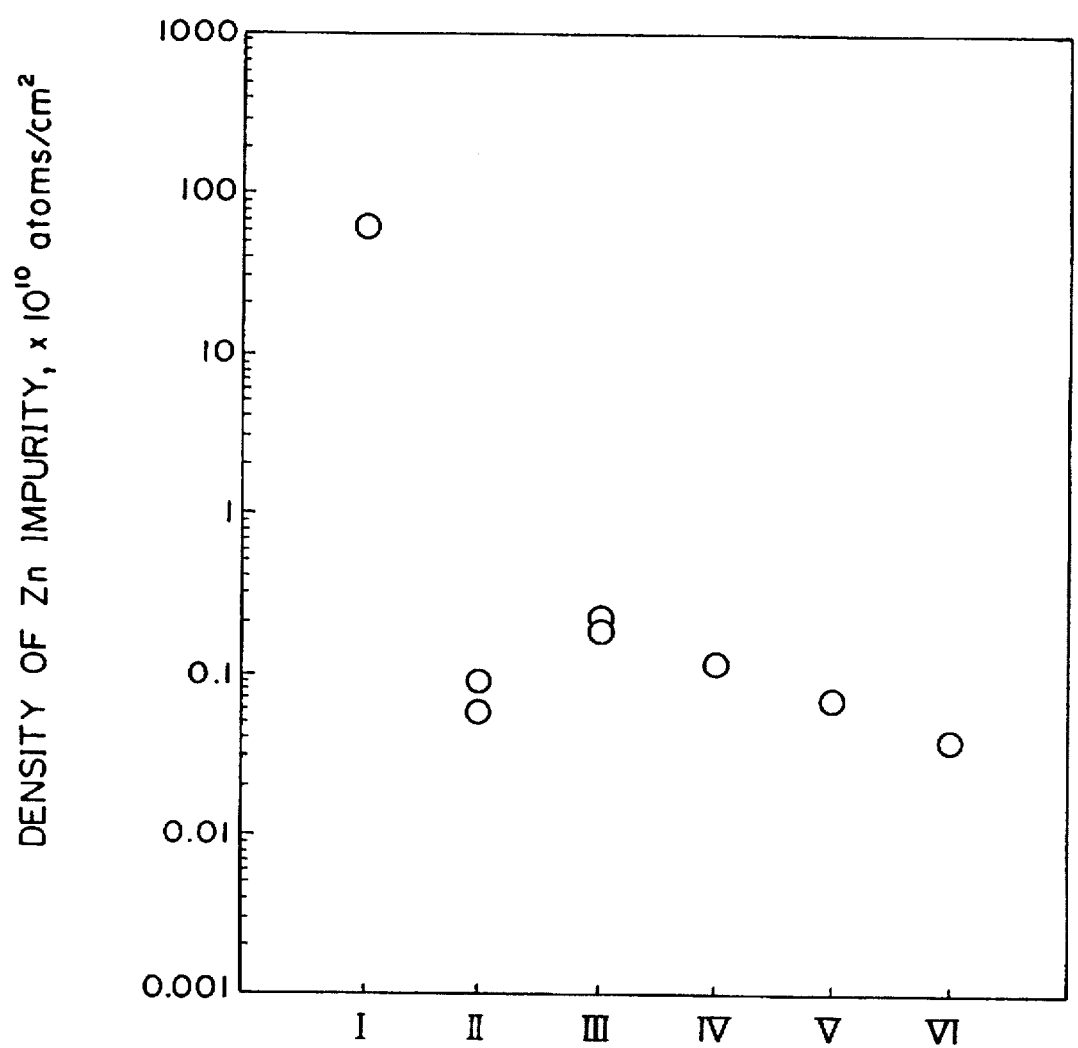
Figure 6E:
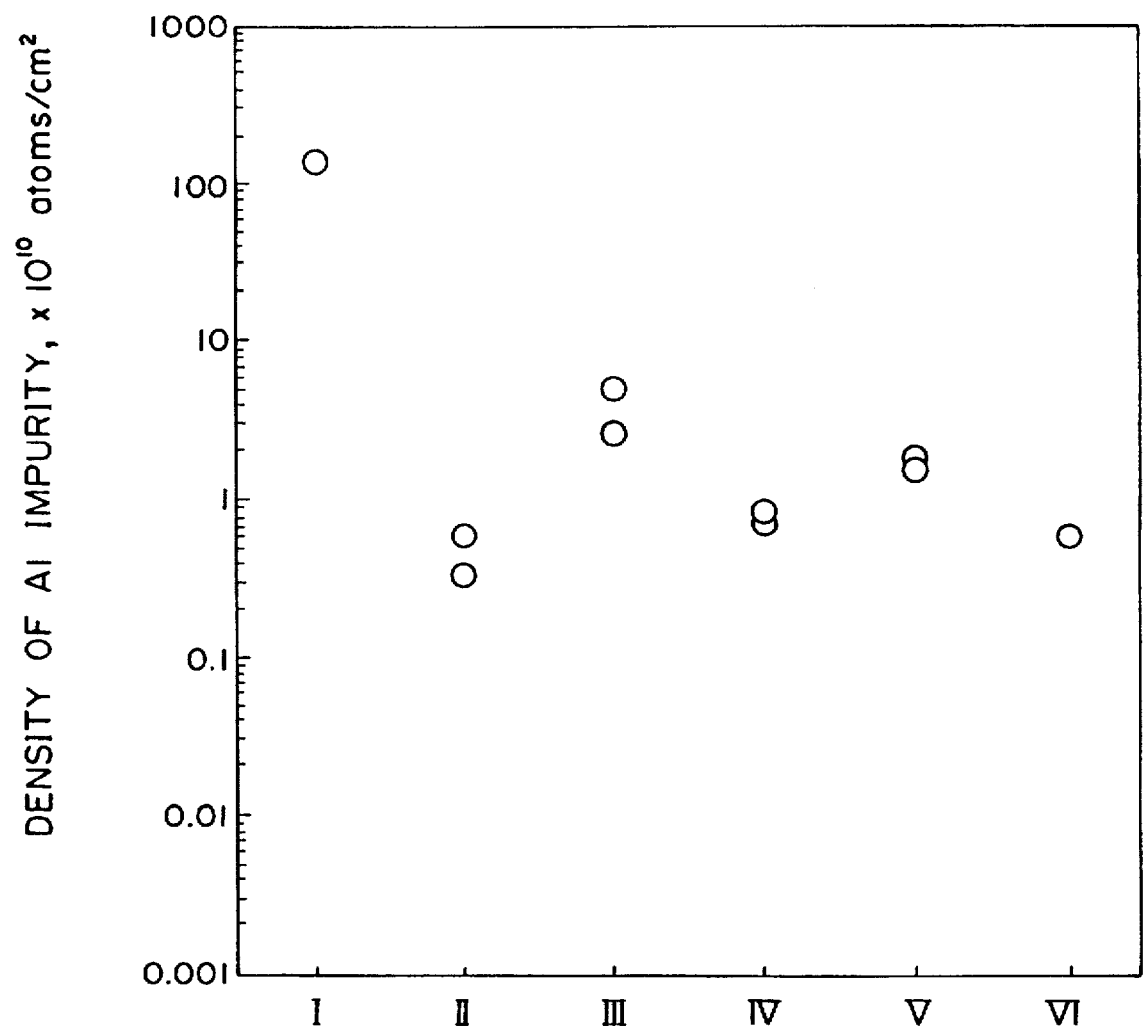

FIGS. 4A and 4B are each a schematic illustration of a typical flow diagram of the cleaning process of a semiconductor wafer using the apparatus 1 of the invention down to finishing by drying, of which FIG. 4A is for the acidic and alkaline cleaning treatments as well as the rinse treatment using a single cleaning apparatus 1 succeeded by a drying treatment in a drying oven 40 while FIG. 4B shows a complete cleaning process in which a wafer W is treated through a sequence of apparatuses consisting of an acidic cleaning apparatus 1, an alkaline cleaning apparatus 1", two rinse treatment apparatuses 30,30 and a drying apparatus 40.

In order to describe the cleaning process in the system illustrated in FIG. 4A, it would be necessary that the parts of the apparatus 1 or 1' illustrated in FIGS. 1A and 1B or in FIGS. 3A and 3B be renamed so that the anode compartment 3 is now the center compartment, the cathode compartments 4,4 are now side compartments, the anode plates 7,7 are now inward electrodes and the cathode plates 8,8 are now outward electrodes. Thus, a semiconductor wafer W as a workpiece is held in the center compartment 3 in a substantially vertical disposition and, while pure water is introduced continuously into each of the center compartment 3, side compartments 4,4 and, in the apparatus of FIGS. 1A and 1B, the flow passages 6,6 at the bottom thereof and continuously discharged at the top thereof, a direct-current voltage is applied between the inward electrode 7 and outward electrode 8 first with the inward electrodes 7,7 being positive relative to the outward electrodes 8,8 so that hydrogen ions are contained in the water flowing through the center compartment 7 to act as an acidic cleaning solution equivalent to the SC-2 cleaning solution.

After a certain length of time sufficient to complete the acidic cleaning treatment in the above described manner, the polarity of the electrodes is reversed so that each of the inward electrodes 7,7 is now a cathode and each of the outward electrodes 8,8 is now an anode to release hydroxyl ions to the water flowing in the center compartment. Accordingly, the wafer W after the acidic cleaning treatment in the foregoing step is now subjected to an alkaline cleaning treatment equivalent to the SC-1 cleaning treatment.

Although the given description above is given of the sequence of treatments in which the first step is an acidic cleaning treatment and the second step is an alkaline cleaning treatment, it is of course a possible case that the acidic cleaning treatment is preceded by the alkaline cleaning treatment or the two types of the cleaning treatment are alternately repeated several times according to need. When no direct-current voltage is applied between the electrodes 7,8, the apparatus 1 now serves as an apparatus for a rinse treatment with pure water although it is usually unnecessary to undertake a rinse treatment between the acidic and alkaline cleaning treatments and before the drying treatment because the acidity or alkalinity of the cleaning solutions is merely temporary by the electrolysis without containing any acidic or alkaline compound.

As compared with the above described cleaning process by the use of a single cleaning/rinse apparatus of FIG. 4A, it is sometimes the case from the standpoint of practice that the efficiency and productivity of the cleaning process can be higher when the cleaning process is performed in a sequence of apparatuses illustrated in FIG. 4B consisting of a first cleaning apparatus 1 for the acidic cleaning treatment, a second cleaning apparatus 1" for the alkaline cleaning treatment with the polarity of the electrodes reversed to that of the apparatus 1, one or more of rinse apparatuses 30 and a drying apparatus 40 so that enhanced stability can be obtained in the operating conditions in each of the first and second cleaning apparatuses 1 and 1". It is of course optional that the sequential order of the first and second cleaning apparatuses is reversed so as to first undertake the alkaline cleaning treatment followed by the acidic cleaning treatment.

Though optional, it is preferable that ultrasonic waves are applied to the liquid medium in each of the first and second cleaning apparatuses 1 and 1" and the rinse apparatus 30 in order to further increase the efficiency of the cleaning and rinse treatments by operating the ultrasonic transducers 12, 12' and 31 provided at the bottom of the respective apparatuses as is illustrated in FIG. 4B although actual operation of the ultrasonic transducers is a matter of choice depending on various factors of the treatments and object of cleaning or rinse.

The frequency of the ultrasonic waves generated by the ultrasonic transducers 12, 12', 31 provided at the bottom of the cleaning apparatuses 1 and 1" and rinse treatment apparatuses 30,30 is in the range from 500 kHz to 3 MHz but the frequency in the rinse treatment apparatuses 30,30 can be still lower to be 100 kHz or higher.

The structure of the rinse treatment apparatus 30 is not particularly limitative but it can be the same as the cleaning treatment apparatus 1 or 1" from which the partitions 5,5 bearing the electrodes are removed. The drying apparatus 40 is also not particularly limitative and can be conventional including so-called IPA (isopropyl alcohol) vapor-phase drying systems and infrared drying ovens.

In the following, the apparatus and the method for the cleaning treatment of semiconductor wafers are described in more detail by way of examples and comparative examples.

EXAMPLES 1-1 TO 1-4 AND COMPARATIVE EXAMPLES 1-1 AND 1-2

The workpieces to be subjected to a cleaning treatment in each of these experiments were each a mirror-polished p-type semiconductor silicon wafer of 150 mm diameter prepared by slicing a p-type semiconductor single crystal silicon rod grown by the Czochralski (CZ) method by using the cleaning apparatus illustrated in FIGS. 1A and 1B according to the procedure shown in FIG. 4A.

The apparatus for the cleaning test of the wafers was that illustrated in FIGS. 1A and 1B, of which the anode compartment 3 was so wide that a group of 10 wafers W having a diameter of 150 mm could be simultaneously subjected to the cleaning treatment. The wafers W were held by point contact at three lower peripheral positions in a holder 9 at an upright and parallel disposition with a pitch of 6.5 mm and the holder 9 was set at about the middle position between the two opposite anode plates 7,7, which were 210 mm apart, so that the flat surfaces of the wafers W were perpendicular to the surface of the anode plates 7,7. Each of the flow passages 6,6 between a pair of ion exchange membranes 5A,5B and each of the cathode compartments 4,4 had a width of 20 mm. In Examples 1-1 to 1-4 and Comparative Example 1-2, pure water having a resistivity of about 2.5 Mohm·cm was introduced into each of the anode compartment 3, cathode compartments 4,4 and flow passages 6,6 from the pipeline 10 below at a specified flow rate by means of the control valves 11 while, in Comparative Example 1-1, an acidic cleaning solution containing 5% by weight of hydrogen fluoride and 5% by weight of hydrogen peroxide was introduced into the anode compartment 3 alone at the same flow rate, pure water being introduced into the cathode compartments 4,4 and flow passages 6,6. A direct-current voltage of 30 volts or 60 volts was applied in Example 1-1 and in Examples 1-2 to 1-4, respectively, between the anode plate 7 and cathode plate 8 and ultrasonic waves at a frequency of 800 kHz and 1.5 MHz were applied to the water in the anode compartment 3 in Examples 1-3 and 1-4, respectively.

Then a group of the silicon wafers W after completion of the acidic cleaning treatment in the above described manner were subjected to a rinse treatment for 5 minutes in the same apparatus as in the acidic cleaning treatment but without application of the direct-current voltage between the electrodes under flow of pure water followed by a drying treatment in an IPA vapor-phase drying system. Five wafers were taken from each of the six groups and subjected to counting of particles having a particle diameter of 0.18 μm or larger on the mirror-polished surface by using a particle counter (Model LS-6030, manufactured by Hitachi Electronics Engineering Co.) to give the results shown in Table 1 by an average for the five. As is apparent from the table, the cleaning treatment in the inventive cleaning apparatus with application of ultrasonic waves to the cleaning medium was in fact effective to decrease the particles on the wafer surface although the effectiveness could not be high enough since the number of particles could not be decreased to a desirable level of 1000 or smaller per wafer.

Separately, the remaining five of the group of ten of the wafers after the above described treatment were subjected to the determination of the densities of typical metallic impurities including aluminum, copper and iron on the wafer surface by the ICP mass-spectrometric method for a washing solution obtained by washing the mirror-polished surfaces of the wafer with diluted hydrofluoric acid. The results are shown also in Table 1 as an average for the five wafers. The symbol N.D. in this table means that the analytical value was lower than the detection limit by the method which was about $1 \times 10^8$ atoms/cm$^2$.

TABLE 1

|  | DC voltage, volts | Ultrasonic frequency | Particles, per wafer | Metallic impurity, $10^9$ atoms/cm$^2$ Al | Cu | Fe |
| --- | --- | --- | --- | --- | --- | --- |
| Comparative Example 1-1 | — | — | >10000 | 2.9 | 6.2 | 1.9 |
| Comparative Example 1-2 | — | — | >10000 | 580 | 450 | 949 |
| Example 1-1 | 30 | — | 8560 | 7.1 | 3.5 | 4.9 |
| Example 1-2 | 60 | — | >10000 | N.D. | 0.88 | 5.8 |
| Example 1-3 | 60 | 800 kHz | 5950 | N.D. | N.D. | N.D. |
| Example 1-4 | 60 | 1.5 MHz | 4370 | N.D. | N.D. | N.D. |

EXAMPLES 2-1 TO 2-4 COMPARATIVE EXAMPLES 2

The experimental procedure for the cleaning treatment of 150 mm diameter mirror-polished silicon wafers was about the same as in the above described Examples and Comparative Examples excepting for the use of the apparatus illustrated in FIGS. 3A and 3B and modification of the treatment conditions as described below.

The cleaning vessel 2 of the apparatus 1' was made from fused silica glass. Each of the anode plates 7,7 and the cathode plates 8,8 was made from a thin plate of titanium which was perforated to have a large number of perforations of 2 mm diameter at a pitch of 3 mm followed by plating with platinum. Two sheets of a hydrogen-ion exchange membrane (N-117/H$^+$, a product by Du Pont Co.) were each integrally sandwiched between the above prepared perforated and platinum-plated plates, which served, one, as the anode plate 7 and, the other, as the cathode plate 8, to obtain a pair of electrode plate-bearing ion exchange membranes with which the cleaning vessel 2 was partitioned into an anode compartment 3 and a pair of cathode compartments 4,4 on both sides of the anode compartment 3. The distance between the oppositely facing anode plates 7,7 was 240 mm.

While keeping a flow of pure water having a resistivity of 2.5 Mohm·cm through each of the anode compartment 3 and cathode compartments 4,4, a direct-current voltage of up to 13.9 volts was applied between the anode plate 7 and cathode plate 8 to find that electrolytic currents therebetween of 40 A, 50 A, 60 A and 80 A were obtained with the DC voltages of 9.2 volts, 10.8 volts, 12.2 volts and 13.9 volts, respectively. Evolution of oxygen gas and hydrogen gas was noted on the surface of the respective electrode plates and the pH value of the water in the anode compartment 3 was decreased to 6 to 4. The oxidation-reduction potential (ORP) was increased to 1100 mvolts at the largest.

As a further test for reference, analysis to determine the content of metallic impurities was conducted for three samples of water flowing through the respective compartments. Thus, pure water of about 2.5 Mohm·cm resistivity was continuously introduced into the anode compartment 3 and cathode compartments 4,4 with application of a direct-current voltage of 12 volts to give a current of 60 A and application of ultrasonic waves of 800 kHz frequency to the water in the anode compartment 3. Determination of various metallic impurities was conducted for three samples including hydrogen ion-containing water taken from the anode compartment 3, hydroxyl ion-containing water taken from the cathode compartment 4 and water before introduction into the apparatus to give the results shown by the diagram in FIG. 5. It is understood therefrom that application of the direct-current voltage and ultrasonic waves is generally effective to decrease the contents of metallic impurities.

Examples 2-1 to 2-4 and Comparative Example 2 were undertaken to show the effectiveness of the inventive cleaning method for the removal of metallic impurities from silicon wafers. Thus, silicon wafers were held in the anode compartment 3 in a vertical disposition under continuous introduction of pure water of about 2.5 Mohm·cm resistivity into each of the compartments. The particular conditions in each of the experiments were as follows.

Comparative Example 2: cleaning with water acidified by 1000 ppm of hydrofluoric acid used in place of pure water without application of a DC voltage and ultrasonic waves at 800 kHz frequency Example 2-1: cleaning with hydrogen-ion water with application of 18 volts DC voltage, 60 A current but without application of ultrasonic waves Example 2-2: cleaning first with hydrogen-ion water under the same conditions as in Example 2-1 and then with the same acidified water under the same conditions as in Comparative Example 2

Example 2-3: cleaning first with the same acidified water under the same conditions as in Comparative Example 2 and then with the hydrogen-ion water under the same conditions as in Example 2-1

Example 2-4: cleaning with hydrogen-ion water under the same conditions as in Example 2-1 with concurrent application of ultrasonic waves at 800 kHz frequency The silicon wafers either before the cleaning treatment or after the cleaning treatment under the above described conditions were washed with diluted hydrofluoric acid and the washing solution was analyzed by the ICP mass-spectrometric method for the densities of metallic impurities on the wafer surface to give the results shown in FIGS. 6A, 6B, 6C, 6D and 6E for the metallic elements of copper, iron, nickel, zinc and aluminum, respectively. The plots in these figures numbered I, II, III, IV, V and VI show the results for the wafers before the cleaning treatment and the wafers after cleaning in Comparative Example 2 and Examples 2-1, 2-2, 2-3 and 2-4, respectively.

As is understood from these figures, the cleaning procedure according to the inventive method in Examples 2-1 to 2-4 is so effective for the removal of metallic impurities as to be comparable with or even better than the effectiveness in Comparative Example 2.

EXAMPLES 3-1 TO 3-4 AND COMPARATIVE EXAMPLES 3-1 AND 3-2

Five a group of the silicon wafers of six groups after the particle counting in Examples 1-1 to 1-4 and Comparative Examples 1-1 and 1-2 were further subjected to an alkaline cleaning treatment in the same cleaning apparatus as in the former experiments excepting reversal of the polarity of the electrodes thus to convert the anode plates 7,7 to cathodes and the cathode plates 8,8 to anodes in Examples 3-1 to 3-4. No direct-current voltage was applied to the electrodes in Comparative Examples 3-1 and 3-2.

While pure water was passed through each of the compartments and the flow passages, an alkaline aqueous cleaning solution containing 5% by weight of ammonia NH$_4$OH and 5% by weight of hydrogen peroxide H$_2$O$_2$ was passed through the center compartment, which was now a cathode compartment, in Comparative Example 3-1. The wafers after this alkaline cleaning treatment was rinsed with pure water and dried followed by counting of particles on the mirror-polished surfaces to give the results of the number as an average for the five wafers shown in Table 2 which also gives the direct-current voltage and frequency of the ultrasonic waves, when applied.

As is clear from this table, the effectiveness of the inventive method for the removal of particles by the alkaline cleaning treatment is higher than the alkaline cleaning treatment using a conventional alkaline cleaning solution. This superiority of the inventive method by the sequence of the acidic and alkaline cleaning treatments is even more remarkable when ultrasonic waves are applied to the cleaning medium in the compartment.

TABLE 2

|  | DC voltage, volts | Ultrasonic frequency | Number of particles |
|---|---|---|---|
| Comparative Example 3-1 | — | — | 3860 |
| Comparative Example 3-2 | — | — | >10000 |

TABLE 2-continued

|  | DC voltage, volts | Ultrasonic frequency | Number of particles |
|---|---|---|---|
| Example 3-1 | 30 | — | 2300 |
| Example 3-2 | 50 | — | 1950 |
| Example 3-3 | 50 | 800 kHz | 572 |
| Example 3-4 | 50 | 1.5 MHz | 259 |

What is claimed is:

1. A method for the cleaning treatment of a semiconductor wafer in an apparatus comprising:
   (a) a rectangular or square vessel to contain an aqueous medium for cleaning of a semiconductor wafer by holding the semiconductor wafer as a workpiece in a substantially vertical disposition in the center part thereof, said vessel being partitioned in a lengthwise direction into an anode compartment at the center and a pair of cathode compartments on both sides of the anode compartment;
   (b) a pair of partitions each partitioning the anode compartment and one of the cathode compartments, each partition being formed of a pair of hydrogen-ion exchange membranes, one, facing the anode compartment and, the other, facing the cathode compartment, to form a flow passage therebetween;
   (c) a pair of anode plates each bonded to one of the ion exchange membranes on the surface facing the anode compartment; and
   (d) a pair of cathode plates each bonded to one of the ion exchange membranes on the surface facing the cathode compartment at such a position approximately to oppose to the anode plate, which comprises the steps of:
      (A) holding a semiconductor wafer in the anode compartment in a substantially vertical disposition;
      (B) introducing pure water continuously into each of the anode compartment, cathode compartments and flow passages at the bottom thereof;
      (C) discharging the pure water continuously from each of the cathode compartment, anode compartments and flow passages at the top thereof; and
      (D) applying a direct-current voltage between the anode plate and the cathode plate.

2. The method for the cleaning treatment of a semiconductor wafer as claimed in claim 1 in which ultrasonic waves are applied to the pure water in the anode compartment.

3. The method for the cleaning treatment of a semiconductor wafer as claimed in claim 2 in which the frequency of the ultrasonic waves is in the range from 500 kHz to 3 MHz.

4. A method for the cleaning treatment of a semiconductor wafer in an apparatus comprising:
   (a) a rectangular or square vessel to contain an aqueous medium for cleaning of a semiconductor wafer by holding the semiconductor wafer as a workpiece in a substantially vertical disposition in a center part thereof, said vessel being partitioned in the lengthwise direction into an anode compartment at the center and a pair of cathode compartments on both sides of the anode compartment;
   (b) a pair of hydrogen-ion exchange membranes each partitioning the anode compartment and one of the cathode compartments;
   (c) a pair of anode plates each bonded to one of the ion exchange membranes on the surface facing the anode compartment; and
   (d) a pair of cathode plates each bonded to one of the ion exchange membranes on the surface facing the cathode compartment at such a position approximately to oppose to the anode plate, which comprises the steps of:
      (A) holding a semiconductor wafer in the anode compartment in a substantially vertical disposition;
      (B) introducing pure water continuously into each of the anode compartment and cathode compartments at the bottom thereof;
      (C) discharging the pure water continuously from each of the anode compartment and cathode compartments at the top thereof; and
      (D) applying a direct-current voltage between the anode plate and the cathode plate.

5. The method for the cleaning treatment of a semiconductor wafer as claimed in claim 4 in which ultrasonic waves are applied to the pure water in the anode compartment.

6. The method for the cleaning treatment of a semiconductor wafer as claimed in claim 5 in which the frequency of the ultrasonic waves is in the range from 500 kHz to 3 MHz.

7. A method for the cleaning treatment of a semiconductor wafer in an apparatus comprising:
   (a) a rectangular or square vessel to contain an aqueous medium for cleaning of a semiconductor wafer by holding the semiconductor wafer as a workpiece in a substantially vertical disposition in a center part thereof, said vessel being partitioned in the lengthwise direction into a center compartment at the center and a pair of side compartments on both sides of the center compartment;
   (b) a pair of partitions each made of a hydrogen-ion exchange membrane partitioning the center compartment and one of the side compartments;
   (c) a first pair of electrode plates each bonded to one of the partitions on the surface facing the center compartment; and
   (d) a second pair of electrode plates each bonded to one of the partitions on the surface facing the side compartment at such a position approximately to oppose to the electrode plate of the first pair, which comprises the steps of:
      (A) holding a semiconductor wafer in the center compartment in a substantially vertical disposition;
      (B) introducing pure water continuously into each of the center compartment and side compartments at the bottom thereof;
      (C) discharging the pure water continuously from each of the center compartment and side compartments at the top thereof; and
      (D) applying a direct-current voltage between the electrode plates of the first pair and the second pair, the electrode plates of the first and the second pairs being the anode and cathode, respectively.

8. The method for the cleaning treatment of a semiconductor wafer as claimed in claim 7 which further comprises the step of:
   (E) applying a direct-current voltage between the electrode plates of the first pair and the second pair, the electrode plates of the first pair and the second pair being the cathode and anode, respectively.

9. The method for the cleaning treatment of a semiconductor wafer as claimed in claim 8 in which the step (D) precedes the step (E).

10. The method for the cleaning treatment of a semiconductor wafer as claimed in claim 8 in which the step (E) precedes the step (D).

11. The method for the cleaning treatment of a semiconductor wafer as claimed in claim 7 which further comprises the step of:

(F) applying ultrasonic waves to the water contained in the center compartment.

12. The method for the cleaning treatment of a semiconductor wafer as claimed in claim 11 in which the frequency of the ultrasonic waves is in the range from 500 kHz to 3 MHz.

13. A method for the cleaning treatment of a semiconductor wafer in an apparatus comprising:

(a) a rectangular or square vessel to contain an aqueous medium for cleaning of a semiconductor wafer by holding the semiconductor wafer as a workpiece in a substantially vertical disposition in a center part thereof, said vessel being partitioned in the lengthwise direction into an anode compartment at the center and a pair of cathode compartments on both sides of the anode compartment;

(b) a pair of hydrogen-ion exchange membranes each partitioning the anode compartment and one of the cathode compartments;

(c) a pair of anode plates each bonded to one of the ion exchange membranes on the surface facing the anode compartment;

(d) a pair of cathode plates each bonded to one of the ion exchange membranes on the surface facing the cathode compartment at such a position approximately to oppose to the anode plate; and (e) a pair of hydrogen ion-permeable membrane each forming a sub-compartment between the anode compartment and one of the anode plates, which comprises the steps of:

(A) holding a semiconductor wafer in the anode compartment in a substantially vertical disposition;

(B) introducing pure water continuously into each of the anode compartment and cathode compartments at the bottom thereof;

(C) discharging the pure water continuously from each of the anode compartment and cathode compartments at the top thereof;

(D) introducing an aqueous solution of an electrolyte continuously into each of the sub-compartments at the bottom thereof;

(E) discharging the aqueous solution of an electrolyte continuously from the sub-compartment at the top thereof; and (F) applying a direct-current voltage between the anode plate and the cathode plate.

14. The method for the cleaning treatment of a semiconductor wafer as claimed in claim 13 in which the electrolyte is an acid or a neutral salt free from halogen.

* * * * *